United States Patent [19]

Rostoker

[11] Patent Number: 5,300,815
[45] Date of Patent: Apr. 5, 1994

[54] TECHNIQUE OF INCREASING BOND PAD DENSITY ON A SEMICONDUCTOR DIE

[75] Inventor: Michael D. Rostoker, San Jose, Calif.

[73] Assignee: LSI Logic Corporation, Milpitas, Calif.

[21] Appl. No.: 935,449

[22] Filed: Aug. 25, 1992

Related U.S. Application Data

[63] Continuation-in-part of Ser. No. 916,328, Jul. 17, 1992.

[51] Int. Cl.$^5$ ............... H01L 29/400; H01L 21/280
[52] U.S. Cl. ................................. 257/786; 437/180
[58] Field of Search ............. 257/784, 786, 666, 668; 437/180, 182

[56] References Cited

U.S. PATENT DOCUMENTS 5,091,825  2/1992  Hill et al. ........................ 257/786

FOREIGN PATENT DOCUMENTS 2942394  5/1980  Fed. Rep. of Germany ...... 257/786
2616964  12/1988  France ............................. 257/786
0182551  10/1984  Japan ............................... 257/786
0154652  8/1985  Japan ............................... 257/784
0212050  9/1986  Japan ............................... 257/786

OTHER PUBLICATIONS

Translation of De 29 42 394 to Usami et al. (May 1980) 15 pages, 257/786.

Primary Examiner—Rolf Hille
Assistant Examiner—Peter Toby Brown
Attorney, Agent, or Firm—Gerald E. Linden; Kevin P. McAndrews

[57] ABSTRACT

A novel technique for increasing bond pad density is described whereby non-square bond pads are shaped, sized and oriented such that each bond pad closely conforms to the shape of the contact footprint made therewith and are aligns to the approach angle of the conductive line to which it is connected. A variation on the inventive technique provides for alternating, interleaved, complementary wedge-shaped bond pads which provide for high bond pad density while accommodating a wide range of approach angles.

10 Claims, 7 Drawing Sheets

PRIOR ART

Figure 1

PRIOR ART

TECHNIQUE OF INCREASING BOND PAD DENSITY ON A SEMICONDUCTOR DIE

CROSS-REFERENCE TO RELATED APPLICATIONS

This is a continuation-in-part of U.S. patent application Ser. No. 916,328 entitled METHOD OF INCREASING THE LAYOUT EFFICIENCY OF DIES ON A WAFER, AND INCREASING THE RATIO OF I/O AREA TO ACTIVE AREA PER DIE, filed Jul. 17, 1992 by Michael D. Rostoker.

TECHNICAL FIELD OF THE INVENTION

The invention relates to design and fabrication of semiconductor dies, and more particularly to the fabrication of bond pads on a semiconductor die.

BACKGROUND OF THE INVENTION

Today's semiconductor technology has been advancing in a direction that requires ever increasing numbers of interconnections with integrated circuits. Typically a large number of integrated circuits are formed on a silicon wafer, then are sliced into individual integrated circuit dies (or chips). Each die is then packaged and used.

Electrical connections to the dies are made in one of a few ways. In one type of package, a die-receiving area (or die receiving cavity) is provided in the package to receive an integrated circuit die. A number of conductive lines (traces or leads) whose outer ends are electrically connected to pins or leads on the package extend inward towards the die receiving area, usually in a radial pattern, stopping just short of the periphery of the die. The die has a number of "bond pads" for the purpose of making electrical connections therewith, and is mounted such that the bond pads are exposed. The inner ends of these conductive traces or leads are disposed such that they form an array of connection points surrounding the die. Very thin "bond wires" (usually gold) are then used to connect the connections points on a one-for-one basis with the bond pads on the integrated circuit die. Each bond wire has an "approach angle" to the die. After mounting, the area or cavity containing the die and the bond wires is usually sealed with a cover or an encapsulant to protect them from moisture or other physical damage.

In another type of package, commonly referred to as "TAB" (Tape Automated Bonding) packaging, a lead frame is provided in a tape format. Each lead frame has a die-receiving area, where the semiconductor die is mounted. The leads (conductive leads) in the lead frame typically approach the die-receiving area in a radial pattern, with their inner ends forming contact points to which the die will be connected. The die has a matching pattern of "bond pads". The die is mounted such that the bond pads align with and make electrical contact with the contact points of the lead frame.

Often, an integrated circuit die may be used in one of several different packages. For example, the same die may be packaged in a plastic or ceramic DIP package (dual inline package), a leadless chip carrier (LCC), a plastic leaded chip carrier (PLCC), etc.. While these packages have a die-receiving area and conductive traces in common, the arrangement of conductive traces in the die-receiving area may be slightly different from one package to another. As a result, the approach angle of a bond wire running to any given bond pad on the die from a corresponding conductive trace may vary somewhat from package to package.

As mentioned before, "conductive traces" are generally printed traces on a ceramic substrate or on a printed circuit board. "Conductive leads" are usually conductors in a lead-frame, such as in a TAB package. For the purposes of this specification, the term "conductive lines" will be used hereinafter to refer collectively to conductive leads, conductive traces, and bond wires.

Figure 1:
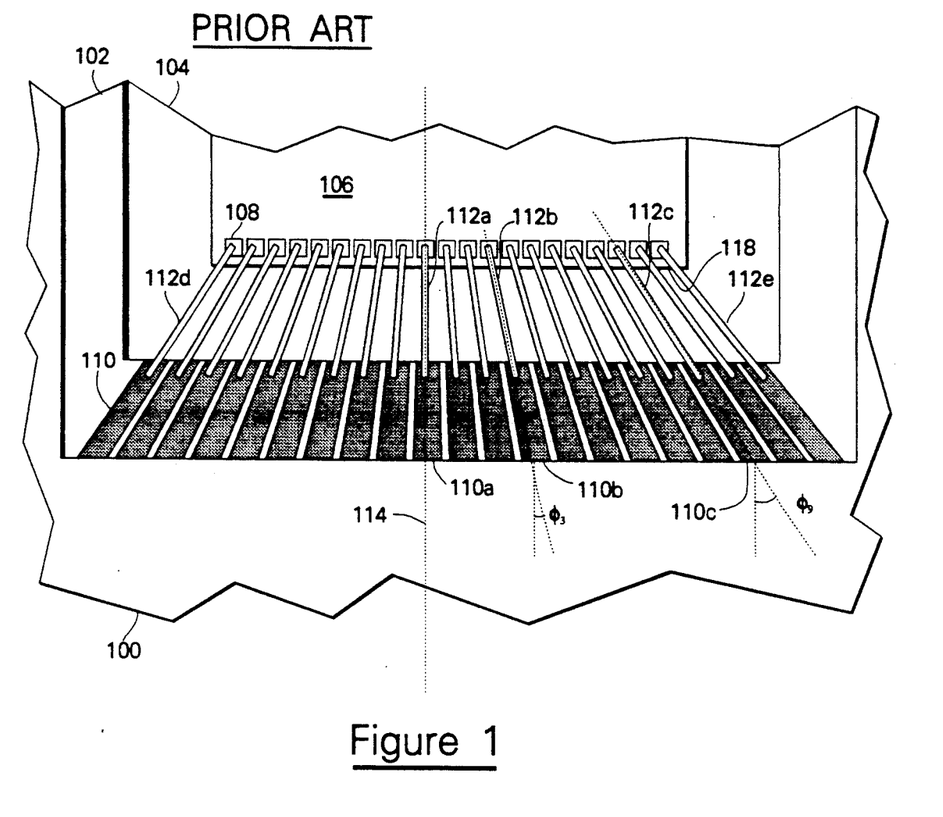
FIG. 1 is a plan view of a typical prior art bond pad arrangement and bond wire connections thereto.

FIG. 1 show a portion of a typical semiconductor device package 100 of the prior art. A die 106 is mounted in a die-receiving area 104. Around the periphery of the die-receiving area 104 is a raised surface 102 with a number of conductive traces 110. These traces are shown along one side only for illustrative clarity, but are usually disposed along all sides of the die-receiving area 104. A series of square bond pads 108 is arranged along the edges of the die. Again, FIG. 1 shows bond pads along only one edge of the die for illustrative clarity, but bond pads are usually provided along all edges of the die. Bond wires, e.g., 112a, 112b, 112c, 112d, and 112e, connect conductive traces 110 to bond pads 108 on a one-to-one basis. Note that the conductive traces approach the die 106 in a generally radial pattern (fanned-out or fanned pattern), such that the approach angles of conductive traces and bond wires closest to an end of die edge 118 (e.g., 110d, 112d, 110e, and 112e) are the furthest off-perpendicular, while the approach angles of conductive traces and bond wires nearest the center of edge 118 (e.g. 110a and 112a) are substantially perpendicular to the edge 118, with the off-perpendicular component of approach angles generally increasing with increasing distance from the center of the edge. A centrally located conductive trace 110a and bond wire 108a approach the die such that their approach angle (as shown by dashed line 114) is substantially perpendicular to the edge of die 106. Another conductive trace 110b and bond wire 112b, located three traces (and bond wires) away from the centrally located conductive trace 110a (and bond wire 112a), approaches the die 106 at an off-perpendicular angle $\theta_3$. Yet another conductive trace 110c and bond wire 112c, located nine traces (and bond wires) away from the centrally located conductive trace 110a (and bond wire 112a), approach the die at an off-perpendicular angle $\theta_9$ (greater than $\theta_3$).

Figure 2:
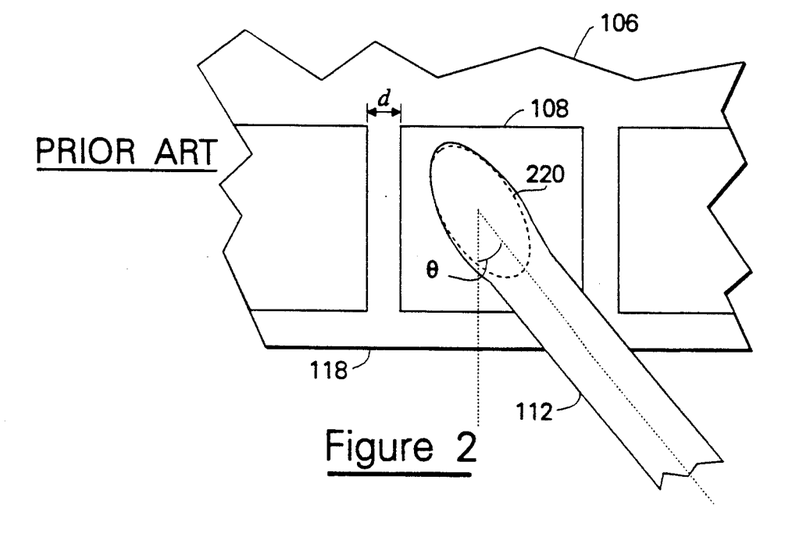
FIG. 2 is a plan view of a typical attachment of a bond wire to a bond pad according to the prior art.

FIG. 2 shows a cutaway of die 106. A typical bond wire 112 is shown attached to a typical square bond pad 108. An inter-pad spacing of "d" is shown, between bond pads. The bond wire 112 comes in at an approach angle $\theta$. The contact area 220 formed by the bond wire 112 with the bond pad 108 is generally elliptical. This is typical of contact footprints between bond wires and bond pads which usually have an elongated shape, with the "elongated dimension" (or "major axis" of the shape, defined hereinbelow) substantially aligned with the approach angle.

Typical prior art bond pads are square, as shown in FIGS. 1 and 2, and are capable of receiving bond wires over a wide range of approach angles, since a bond pad is typically much larger than the contact footprint formed between it and a bond wire (or conductive lead in a TAB package). Usually, there is a required minimum inter-pad spacing "d" to minimize the possibility of shorting or coupling between adjacent bond pads or bond wires.

As stated previously, however, there is a great deal of pressure in modern integrated circuit technology to provide greater numbers of interconnections (i.e., bond pads) to integrated circuit dies. Unfortunately, there is a limited amount of space along the edges of an integrated circuit die for bond pads. One possible solution is to provide multiple rows of bond pads along the edges of the die, but this would require bond wires to cross over one another, creating a serious risk of a short circuit, even if the rows of bond pads are staggered. This problem is especially serious if there is a wide range of approach angles to bond pads possible for different packages.

DISCLOSURE OF THE INVENTION

It is therefore an object of the present invention to provide a technique for increasing the number of bond pads on an integrated circuit die.

It is another object of the present invention to provide bond pads which can accommodate a range of approach angles.

It is a further object of the present invention to provide a technique for increasing the number of bond pads on an integrated circuit die which can be accomplished in a single row of bond pads.

According to the invention, elongated or "certain non-square" bond pads, described hereinbelow, which conform closer to a contact footprint shape than do prior-art bond pads, permit closer center-to-center spacing of bond pads that do prior-art bond pads, while maintaining comparable inter-pad spacing.

In one embodiment of the invention elongated bond pad shapes are defined which conform roughly to the shape of a contact footprint. Bond pads having this shape are then disposed along a side of an integrated circuit die and oriented such that they substantially align with the conductive lines to which they will be connected.

In another embodiment of the invention, the side of the die is a straight edge, and the bond pads are arranged to align with a radial or "fanned" pattern of conductive lines.

In another embodiment, the semiconductor die is further adapted to be mounted in a die receiving area of a substrate, such as a ceramic package, a printed circuit board, or a TAB package, and the bond pads are shaped and aligned to the approach angle and contact footprint of the conductive lines to be connected thereto.

In various embodiments, the conductive lines may be bond wires, conductive traces, or conductive leads.

In another embodiment, the bond pad shapes are defined by defining a contact footprint shape, choosing an elongated shape and sizing it such that it encloses the contact footprint shape. Another embodiment elaborates on this technique by providing a safety zone around the contact footprint shape to allow for errors in placement, approach angle, or variations in contact footprint shape. The elongated shape is then sized to enclose the safety zone.

Other embodiments provide for specific elongated shapes, including elongated rectangular shapes, parallelogram shapes, trapezoidal shapes, tapered shapes, and non-polygonal curved shapes (for example, elliptical, cardioid, trochoid, or "egg-shaped" curves).

In another embodiment of the invention, "certain non-square" bond pad shapes are defined by defining a pivot point in a contact footprint, defining a "swept contact area" by rotating (sweeping) the contact footprint through a range of angles, then shaping and sizing a polygonal or curved shape to closely conform to and enclose the swept contact area. Another embodiment adds to this technique by adding a safety zone around the swept contact area and additionally requiring that the bond pad further enclose the safety zone. Still another embodiment defines an "anchor point" within the bond pad shape according to the location of the pivot point in the swept contact area around which the bond pad shape was defined.

Often, "certain non-square" shapes will have a sort of "wedge" shape to them, particularly if the pivot point is defined off-center of the elongated contact footprint. It is also possible to move the pivot point to the other end of the contact footprint to generate complementary shapes. The possibility of complementary shapes suggests the possibility of arranging such shapes in an alternating interleaved linear array, providing the benefits of both higher bond pad density and a wide range of approach angles.

Other embodiments of the invention deal with arranging alternating interleaved arrays of bond pads along one or more edges of a semiconductor die.

Another embodiment of the invention provides for connecting bond wires to alternating interleaved arrays of bond pads by allowing for alternating locations of anchor points on bond pads and different pivot points (mounting reference points relative to the ends) on bond wires depending upon the bond pads to which they will be connected.

The observation can be made that the actual bond pad space used by a bond wire is the area covered by the contact footprint made by the bond wire with the bond pad. Allowing a safety zone outside of this space for variations in contact footprint from bond pad to bond pad, and for slight error in placement and approach angle, it can be seen that the minimum required area of a bond pad is only slightly larger than the contact footprint. Since the contact footprint is usually an elongated shape substantially aligned with the approach angle of the bond wire, a similarly shaped and oriented bond pad (elongated bond pad) may be used. This sort of bond pad requires significantly less space along an edge of a die than the bond pads of the prior art, and complementary angled shapes may be nested to take up even less space.

Other objects, features and advantages of the invention will become apparent in light of the following description thereof.

DETAILED DESCRIPTION OF THE INVENTION

In general, the present invention makes use of elongated bond pads which conform roughly to the shaped of the elongated contact footprints made by bond wires or conductive leads attached to bond pads, taking into account slight error in placement, variations in contact footprint, and variations in approach angle.

Figure 3A:
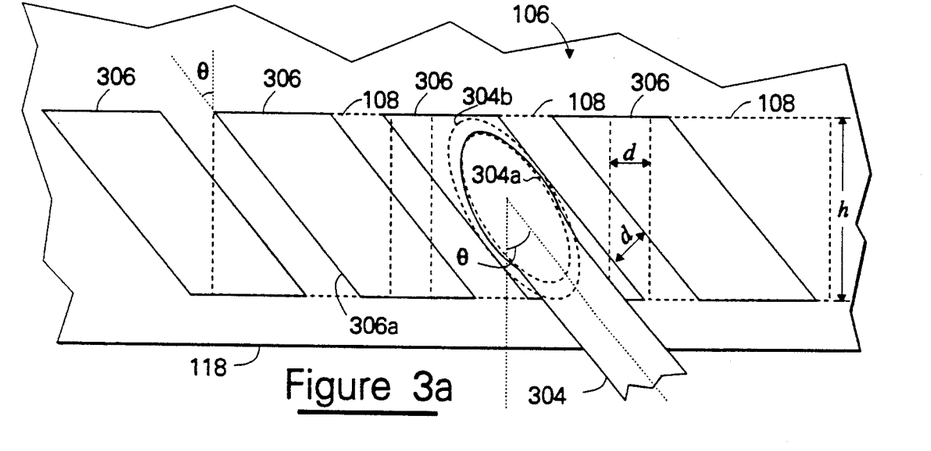
FIGS. 3a–3c are plan views of various approaches to increasing bond pad density, according to the present invention.
Figure 3B:
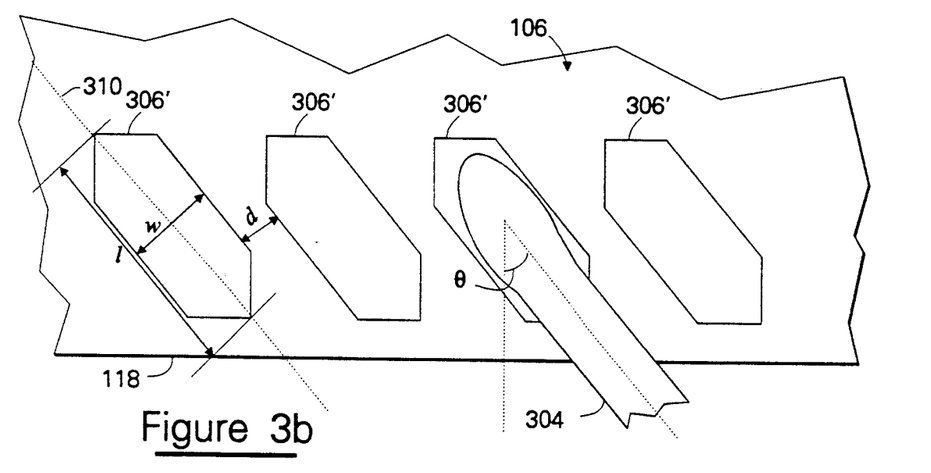
Figure 3C:
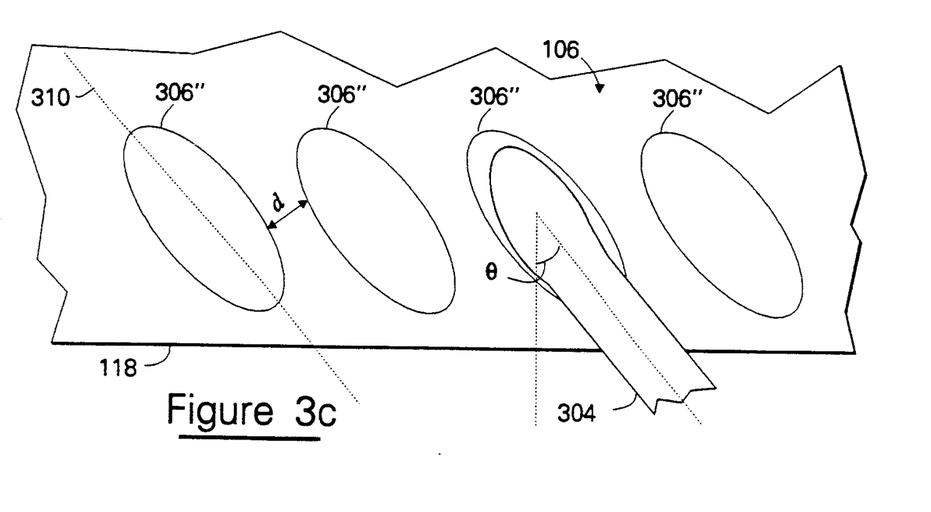

FIGS. 3a-3c shows various possible bond pad shapes and arrangements according to the present invention. For all of these FIGS. 3a-3c, a uniform approach angle is assumed.

FIG. 3a shows a series of elongated parallelogram-shaped bond pads 306 arranged on a die 106 such that a minimum distance "d" is maintained between adjacent bond pads. These bond pads are each designed to accommodate a bond wire, such as bond wire 304, having an approach angle $\theta$. The shape of the bond pads 306 is determined by providing space for a contact footprint 304a and a safety zone 304b around the contact footprint 304a, then fitting a parallelogram to that space requirement. The safety zone 304b allows for slight error in placement of the bond wire (or more generally, the conductive line), slight error in the approach angle, or slight variation in the shape or size of the contact footprint. The slanted sides 306a of the bond pads 306 are substantially aligned with the approach angle $\theta$ of the bond wire 304 and take up significantly less space than do the square bond pads 108 of the prior art, shown in dashed lines for size comparison. Square bond pads 306 have the same height "h" as do the parallelogram-shaped bond pads 306, but have a width equal to their height. The same spacing "d" is maintained between the square bond pads shown here. In this example, four parallelogram shaped bond pads 306 require just about the same area as three square bond pads 108, thus providing approximately a 33% increase in bond pad density over square bond pads, hence allowing for a greater number of electrical interconnections to the die.

It is often desirable, for simplicity of layout, to have one bond pad edge parallel to the edge 118 of the integrated circuit die, and to have an opposing edge parallel thereto. In this manner, the outer edges of the bond pads lie neatly along a pattern roughly matching the shape of the die, and the inside edges of the bond pads lie along a similar shape, reduced in size. When approach angles are not perpendicular to the edge of the die, this results in a bond pad shape similar to the parallelogram shape of FIG. 3a.

FIG. 3b shows an alternate embodiment of bond pads 306' accommodating bond wires 304, according to the present invention. In this case, a somewhat diamond shaped bond pad is used, similar to the parallelogram shaped bond pads of FIG. 3a, but this time corners outside of the safety zone are "trimmed" to provide the shape shown. As in FIG. 3a, a minimum space "d" is maintained between the bond pads. Each bond pad has a long dimension "l" and a short dimension "w". The bond pad is oriented such that the short dimension is maintained generally perpendicular to the approach angle $\theta$ of the bond wires 304, also indicated by line 310. In this case, the approach angle and the long dimension of the bond pad are aligned, but this is not necessarily the case with all elongated shapes. Parallelograms, for example have long and short dimensions which are not necessarily perpendicular to one another. The approach to bond pad alignment illustrated here is to maintain the short dimension of the bond pad perpendicular to the approach angle, which works for many elongated bond pad shapes.

FIG. 3c illustrates non-polygonal bond pads. In this case elliptical bond pads 306" are used. The major axis 310 of the ellipse shape is aligned with the approach angle of the bond pad. The same spacing between bond pads is maintained as in FIGS. 3a and 3b. Any suitable curved shape which can be circumscribed about a safety zone (see, for example, 304b with respect to FIG. 3a) surrounding an elongated contact footprint may be substituted.

The assumption is made herein that the contact footprint made by a bond wire with a bond pad is aligned with the approach angle. It is possible that for some bond wire attachment schemes the contact footprint may be slightly differently oriented. For those schemes, the different contact footprint orientation must be taken into account. However, as long as a contact footprint has an elongated shape, the principle of shaping bond pads to accommodate the contact footprint may be applied to increase bond pad density.

FIGS. 3a-3c have shown various bond pad shapes oriented to accept bond wires arriving at a constant approach angle. However, in reality, bond wires approach from a number of different angles, as is illustrated in FIG. 1.

Figure 4:
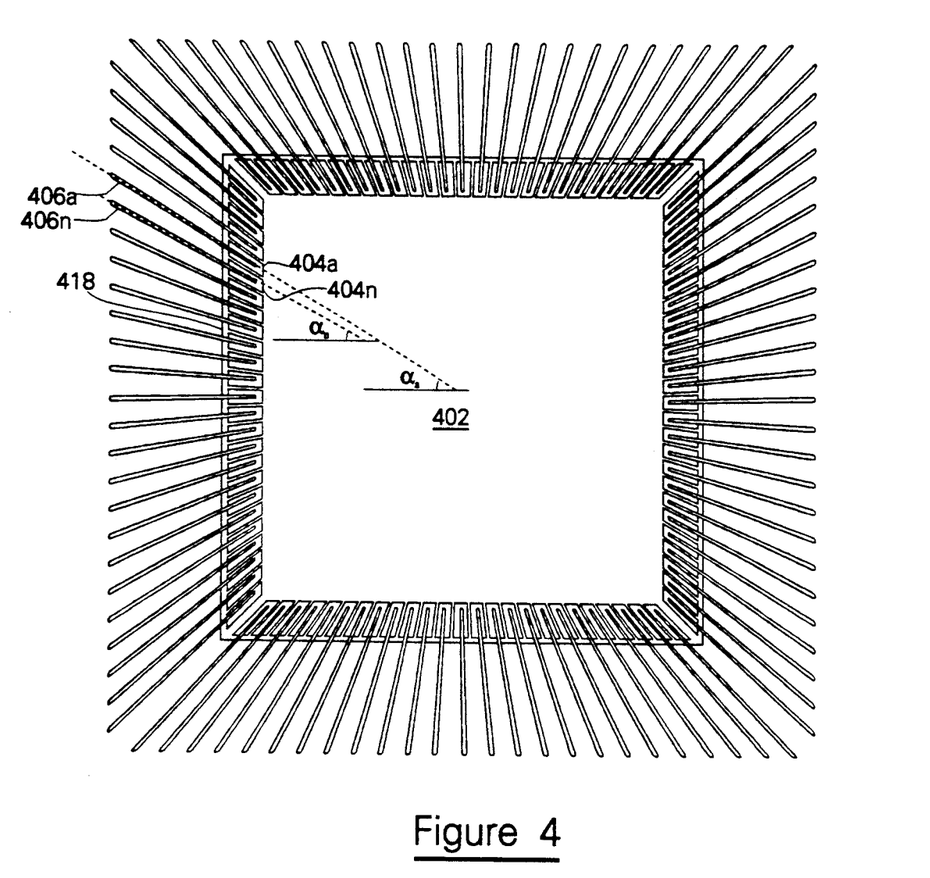
FIG. 4 is a plan view of an integrated circuit die employing the present inventive technique.

FIG. 4 shows a typical die 402 employing the technique of the present invention to a radial pattern of conductive lines 406a..n (two indicated)). Each conductive line 406a..n has its own unique approach angle $a_a..n$. Each bond pad 404a..n is aligned to the approach angle of the corresponding conductive line 406a..n (or to the angle of the contact footprint made therewith, if it is different). As shown, conductive lines 406 approach (fan-in towards) the die 402 in a generally radial pattern.

In order for bond pads to align with a radial pattern of conductive lines while maximizing the number which will fit on a die, it is advantageous to use an elongated tapered pad shape. The bond pads 404a..n shown in FIG. 4 taper slightly towards the center of the die 402.

Figure 5:
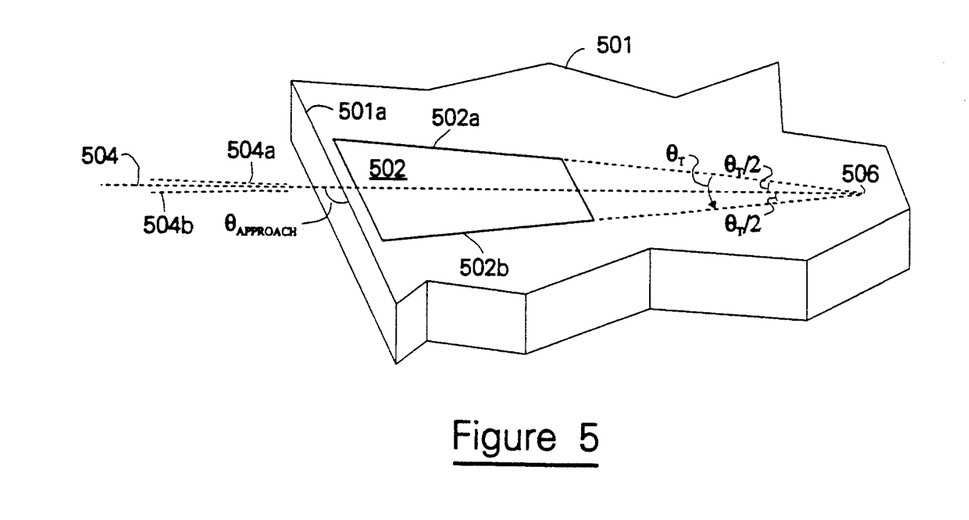
FIG. 5 is a view of a section of an integrated circuit die showing the orientation of a tapered bond pad, according to the present invention.

FIG. 5 shows a tapered bond pad 502 having tapered sides 502a and 502b on a die 501. The bond pad 502 is oriented such that it aligns with an approach angle $\theta_{APPROACH}$ measured between major axis 504 of bond pad 502 and an edge 501a of die 501. Axis 504 indicates the line along which a bond wire or other conductive line will approach the bond pad 502. If lines are extended from tapered sides 502a and 502b, they will eventually meet at a point 506, defining a taper angle $\theta_T$. Ideally axis 504 should bisect this angle, as shown, indicating the ideal angle of approach to tapered bond pad 502. Accordingly, tapered bond pad 502 would be oriented on the die 501 such that its axis 504 aligns with the anticipated approach angle. If a small range of approach angles is anticipated (as indicated by dashed lines 504a and 504b), and assuming that bond pad 502 has been sized to accommodate a range of approach angles, then axis 504 should bisect that range, as shown.

The discussion above with respect to FIGS. 4 and 5 assumes that the major axis of a contact footprint (the line perpendicular to its minimum overall dimension) is in perfect alignment with the approach angle of the conductive line with which it is made. For some methods of attachment, however, there may be an offset between the approach angle of the conductive line and the major axis of the contact footprint. In these cases, the same technique described hereinabove may be used by providing a compensation for this offset in the orientation of the bond pads. That is, use the major axis of the anticipated contact footprint as the approach angle.

All of the bond pads discussed hereinabove with respect to the present invention have, by definition, an "elongated" shape. This is because they have an overall width in a direction generally perpendicular to an expected approach angle which is significantly longer than their overall length along the approach angle. That is, they are long along the anticipated approach path of a bond wire, and narrow across that same approach path. This permits more of these shapes to be arranged along the edge of an integrated circuit die than could be arranged using prior-art square bond pads (See FIGS. 1 and 2).

The discussion hereinabove with respect to FIGS. 1-5 indicates that individual conductive lines (including bond wires) may approach from a range of angles, but the designs of individual bond pads have been for a fairly precise approach angle, allowing only for small errors in placement or approach angle. FIGS. 6a-6d illustrate the design of bond pads according to the present invention where a wider range of approach angles may be encountered at any individual bond pad.

Figure 6A:
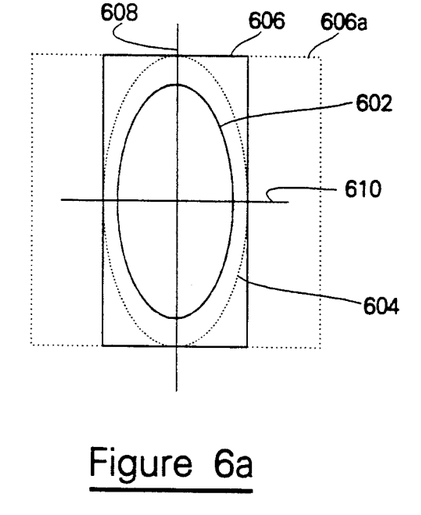
FIGS. 6a–6d plan views of bond pads showing the relationship/between the contact pattern made by a bond wire with a bond pad, the approach angle, "anchor points" and bond pad shape, according to the present invention.

FIG. 6a shows a simple rectangular bond pad 606 designed to accommodate an elliptical contact footprint 502 having a major axis 608 and a minor axis 610. A safety zone 604 is allocated around contact footprint 602, and then rectangular bond pad 606 is sized to fit exactly around the safety zone 604. For size comparison, a square bond pad 606a of the prior art is shown overlaid in dashed lines. This is a particularly good comparison, because square bond pad 606a represents a minimum-size square bond pad. Evidently, the rectangular bond pad permits a greater number of bond pads to be placed along an edge of a die than does the prior-art square bond pad.

Figure 6B:
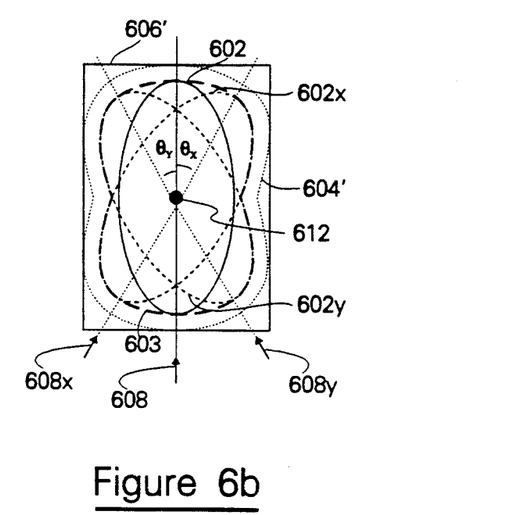

FIG. 6b shows a rectangular bond pad 606' designed to accommodate a wide range of approach angles. Contact footprint 602 (made by an electrical connection to a bond pad by a conductive line) is shown in its nominal position. Contact footprints 602 and 602y represent the orientation of contact footprint 602 if rotated about a point 612 through angles of $\theta_x$ and $\theta_y$, respectively. The pattern formed by sweeping contact footprint 602 through its possible range of approach angles defines the shape and size of a swept contact area 603 which must be allocated on the bond pad for attachment of the conductive line. A safety zone 604' as allocated around the allocated swept contact area to allow for slight errors in placement and variation in contact footprint. Finally a rectangular bond pad shape 606' is determined by circumscribing a rectangle around safety zone 604'. The major axes 608, 608x, and 608y of contact footprints 602, 602x, and 602y, respectively, illustrate the range of approach angles for which pad 606' is designed.

A similar approach may be applied to other shapes, e.g. tapered pads, parallelogram shapes, curved shapes, etc., resulting in bond pad shapes that will be referred to hereinafter as "certain non-square" shapes.

In the extreme, where the range of approach angles is very wide (e.g., +/−45° degrees and greater), the shape of the rectangular (or other shape) bond pads 606' formed as described with respect to FIG. 6b, widens and may become arbitrarily similar to the shape of prior-art square bond pads (e.g., 606a, FIG. 6a), providing no benefit thereover. Evidently, then, there is still a need for a technique which provides both higher bond pad density and accommodation of a very wide range of approach angles)

Figures 6C, 6D:
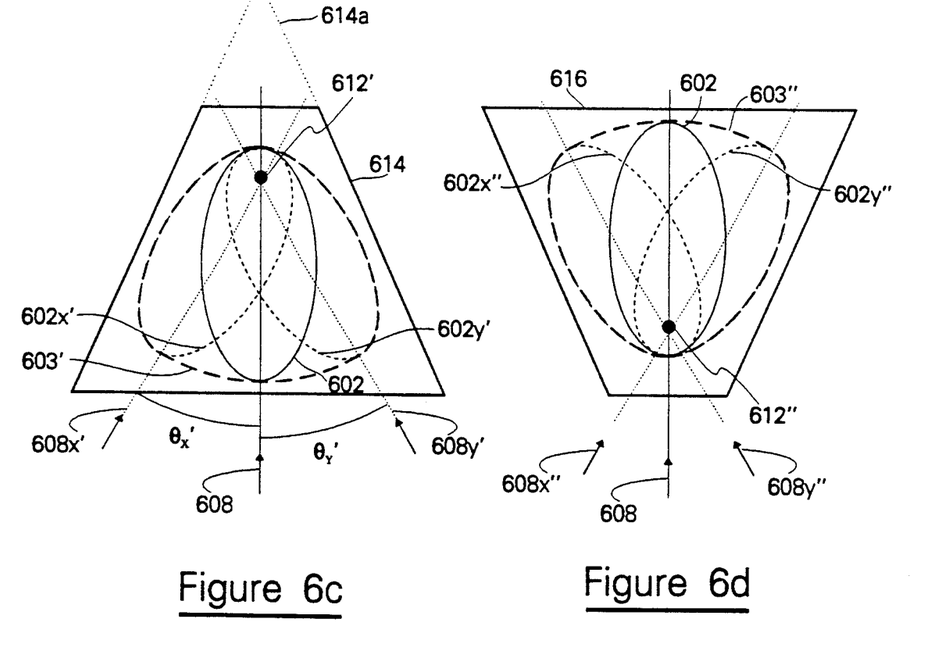

FIGS. 6c and 6d show different bond pad shapes which are derived from changing the pivot point used to determine the swept contact area.

In FIG. 6c, the contact pivot point 612' is moved upward in contact footprint 602 relative to its location 612 in FIG. 6b yielding a differently shaped swept contact area outline 603'. contact footprints 602x' and 602y' represent the position of contact footprint 602 when rotated about pivot point 612' through angles $\theta_x'$ and $\theta_y'$, respectively, as measured from the major axis 608 of contact footprint 602 to the major axes 608x' and 608y' of rotated contact footprints 602x' and 602y', respectively. Allowing for a safe zone (not shown) around swept contact area 603', a convenient polygonal shape is chosen for bond pad 614. This trapezoidal shape matches well with the shape of the swept contact area outline 603' and does not leave a great deal of unallocated space. Alternatively, the triangle shape indicated by adding the area 614a to the trapezoidal bond pad 614 could be used. However, the additional area would be of no benefit for the immediate purposes of the present invention.

In FIG. 6d, the contact pivot point 612" is moved downward in contact footprint 602 relative to its location 612 in FIG. 6b yielding a yet another differently shaped swept contact area outline 603", which is essentially a vertical mirror image of swept contact area outline 603' with respect to FIG. 6c. Contact footprints 602x' and 602y' represent the position of contact footprint 602 when rotated about pivot point 612" through angles of $\theta_x'$ and $\theta_y'$, respectively, as measured from the major axis 608 of contact footprint 602 to the major axes 608x" and 608y" of rotated contact footprints 602x" and 602y", respectively. Allowing for a safe zone (not shown) around swept contact area 603", a polygonal shape similar to that of bond pad 614 is chosen for bond pad 616. Again, this trapezoidal shape matches well with the shape of the swept contact area outline 603" and does not leave a great deal of unallocated space.

Hereinafter, the following definitions apply:

Conductive line: A bond wire, conductive trace, or conductive lead used for direct connection to a bond pad on an integrated circuit die.

Bond pad: An electrical connection point located along an edge of an integrated circuit die.

Contact footprint: The shape of the contact area made between a conductive line and a bond pad.

Elongated contact footprint: an asymmetrical contact footprint which has a length which is greater than its width. Elongated contact footprints have a major axis aligned such that their dimension perpendicular to the axis is as small as possible.

Contact pivot point: A point of reference on a contact footprint about which it is rotated to generate a swept contact area.

Anchor point: A point of reference on a bond pad for connecting to conductive lines.

Expected contact footprint: The contact footprint expected to be formed when a conductive line is connected to a bond pad.

Certain non-square bond pad: A bond pad that is not square, and that substantially conforms to a shape that encloses an area defined by the rotation of an elongated contact footprint through a limited range of angles about a "contact pivot point".

Bond pad axis: Defined by the axis of the elongated contact footprint used to define a "certain non-square" bond pad when at the middle of its range of rotation about the contact pivot point.

Approach angle: The angle a conductive line connected to a bond pad makes with the edge of the integrated circuit die along which the bond pad is located. "Expected approach angle" refers to the approach angle for which a bond pad is designed. In the event that the major axis of a contact footprint is not aligned with the approach angle of a conductive line, then the angle of the major axis of the contact footprint is taken a the approach angle.

Major Axis of a bond pad: The line centered in the expected range of approach angles. This line runs through the anchor point on "certain non-square" bond pads.

Elongated bond pad: A bond pad for which the length along its major axis is greater than its maximum width perpendicular to its major axis by a ratio of at least, for example, 20%, 30%, 50%, 70%, or 100%.

Examples of "certain non-square" bond pad shapes are: "elongated" rectangles (i.e, rectangles having an aspect ratio of greater than 1.2:1), triangles, trapezoids (truncated triangles), parallelograms, ellipses, or any other suitable polygonal or curved shapes.

Every "certain non-square" bond pad has an associated anchor point, expected contact footprint, and contact pivot point. For any approach angle a conductive line will be mounted such that the contact pivot point of the expected contact footprint aligns with the anchor point of the bond pad.

Generally, when the contact pivot point is placed away from the center of the contact footprint, the result will be a "certain non-square" bond pad shape which is wide on one end and narrow on another end. As shown in FIGS. 6c and 6d, it is possible to come up with complementary bond pad shapes (e.g., 614 and 616). It would appear that bond pad shapes 614 and 616, which are complementary to one another, might be useful if arranged in an alternating interleaved pattern. This arrangement is shown in FIGS. 7a and 7b.

Figure 7A:
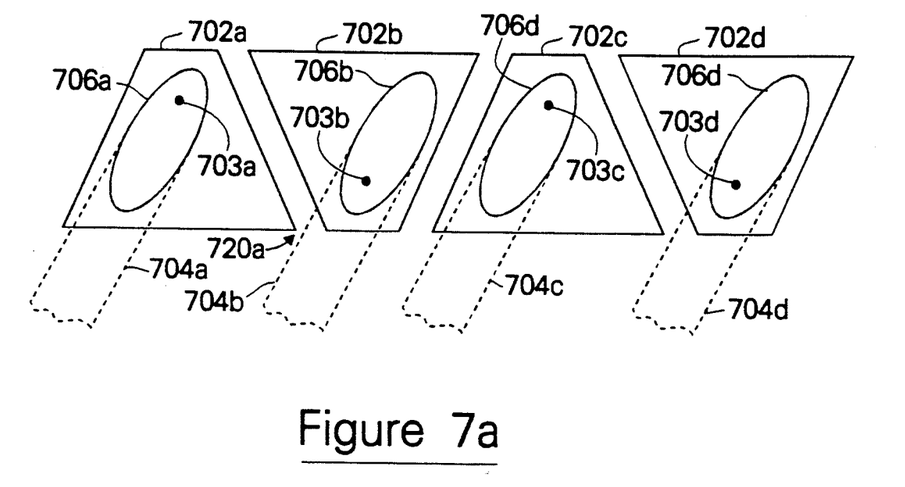
FIGS. 7a–7b are plan views of bond pads, showing an application of an alternating interleaved arrangement of complementary polygonal bond pad shapes, according to the present invention.

In FIG. 7a, bond pads 702a, 702b, 702c, and 702d are arranged in an alternating interleaved array, as shown, where bond pads 702a and 702c (similar to 614 with respect to FIG. 6c) have similar shapes complementary to the shapes of bond pads 702b and 702d (similar to 616 with respect to FIG. 6d). Bond pads 702a, 702b, 702c, and 702d have anchor points located at 703a, 703b, 703c, and 703d, respectively, reflective of the manner in which each shape was derived (refer to FIGS. 6c, 6d). In order to illustrate the method of connection of bond wires to these bond pads, bond wires 704a, 704b, 704c, and 704d, are shown approaching bond pads 702a, 702b, 702c, and 702d, respectively, at approach angles near one extreme of the anticipated range of approach angles used to design the bond pads. The connection of bond wires 704a, 704b, 704c, and 704d to bond pads 702a, 702b, 702c, and 702d, forms contact footprints 706a, 706b, 706c, and 706d, respectively therewith. The bond wires are mounted such that the contact pivot point of contact footprint 706a aligns with the anchor point 703a of bond pad 702a, the contact pivot point of contact footprint 706b aligns with the anchor point 703b of bond pad 702b, the contact pivot point of contact footprint 706c aligns with the anchor point 703c of bond pad 702c, and the contact pivot point of contact footprint 706d aligns with the anchor point 703d of bond pad 702d.

Figure 7B:
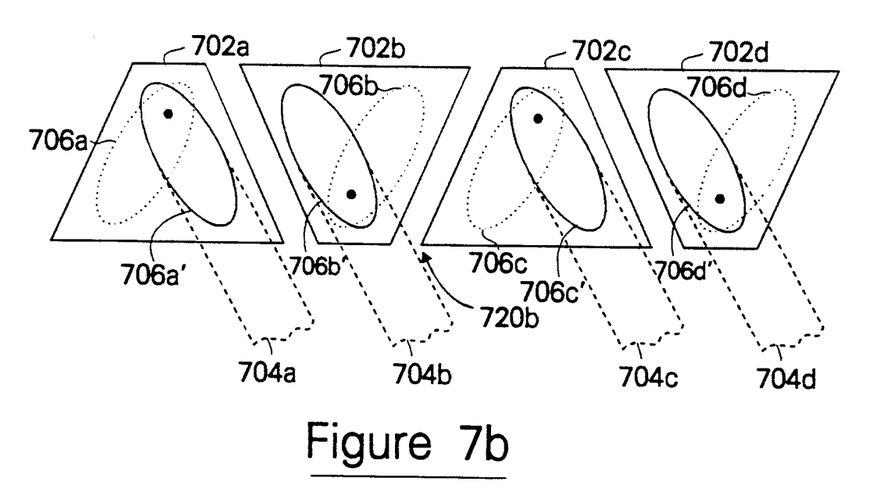

FIG. 7b shows the same bond pads 702a, 702b, 702c, and 702d, and the same bond wires, 704a, 704b, 704c, and 704d, but this time the bond wires have a different approach angle, near the opposite end of the expected range of approach angles from that used in FIG. 7a. Coming from this approach angle, bond wires 704a, 704b, 704c, and 704d, make contact footprints 706a', 706b', 706c' and 706d' respectively. The contact footprints 706a, 706b, 706c, and 706d are superimposed and shown as dotted lines for comparison.

The bond pad arrangements of FIGS. 7a and 7b may encounter problems with shorting or coupling with adjacent bond pads if the bond wires do not arch significantly over the surface of the integrated circuit die before attaching to the bond pads. Note for example the location 720a with respect to FIG. 7a where bond wire 704b closely approaches a corner of bond pad 702a. Also note with respect to FIG. 7b the location 720b where bond wire 702b closely approaches a corner of bond pad 702c.

One approach to solving this problem is to increase the spacing between all bond pads, but this approach would significant reduce the effective bond pad density, eliminating much of the benefit of the present invention.

Figure 7C:
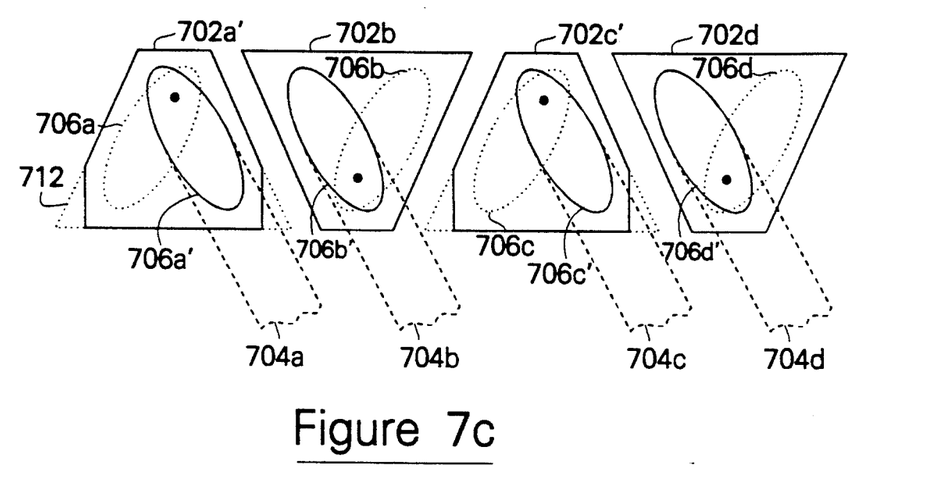
FIGS. 7c and 7d are plan views of bond pads employing a technique for minimizing the risk of shorting and coupling between bond wires and adjacent bond pads, according to the present invention.

A more attractive approach to solving this problem is shown in FIG. 7c, whereby corners 712 of bond pads 712a and 712c are eliminated, yielding modified bond pads 702a' and 702c'. With the elimination of these corners, the potential interference between bond wires and neighboring bond pads is eliminated. Note that modification of bond pads 70b and 702d is not necessary, since the corresponding corners of these bond pads, which are oriented away from the approach path of the bond wires, do not pose a risk of shorting. However, for uniformity (implying simplicity of layout) and to minimize coupling between adjacent bond pads, it may be desirable to modify bond pads 702b and 702d as well.

Figure 7D:
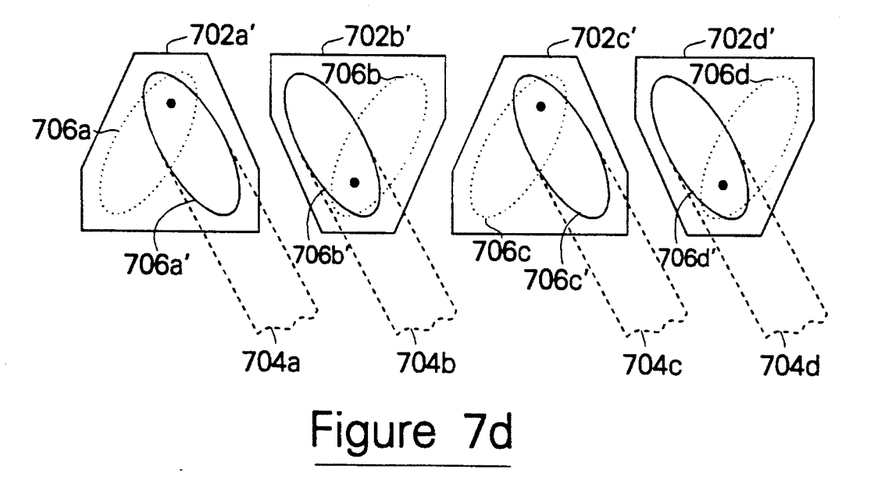

FIG. 7d shows this situation, where all bond pads have the modified shape, including modified bond pads 702b' and 702d'.

Figure 7E:
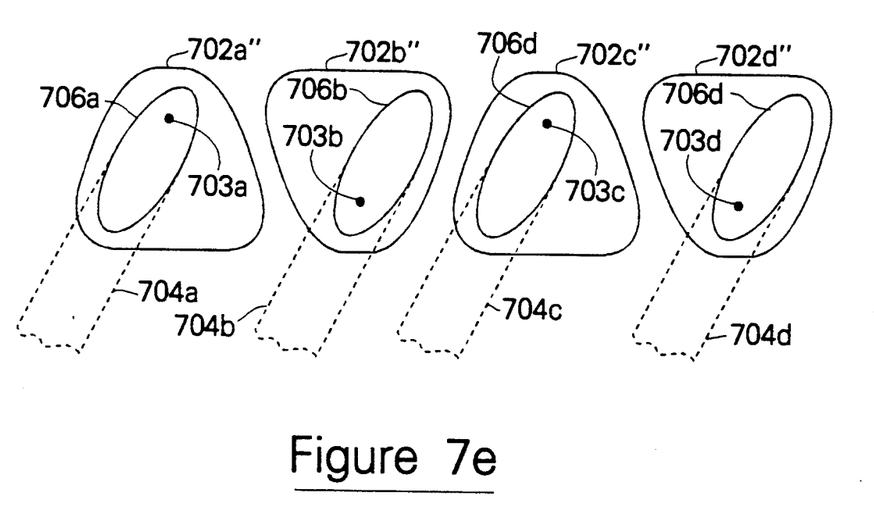
FIG. 7e is a plan view of non-polygonal curved bond pads showing the use of complementary curved shapes for an alternating interleaved arrangement of bond pads, according to the present invention.

An alternative approach is shown in FIG. 7e, where non-polygonal curved shapes closely following the shape of the swept contact area (see FIGS. 6c and 6d) are used for bond pads 702a", 702b", 702c" and 702d". These bond pads have many of the same benefits discussed hereinabove, e.g., improvement of bond pad density, minimal risk of shorting or coupling between bond wires and adjacent bond pads, minimal coupling between bond pads, etc..

This approach of using interleaved bond pads requires that the method used to mount bond wires to such pads must take into account the varying (alternating) locations of anchor points relative the edge the semiconductor die and pivot points relative to the contact footprints that will be made with the bond wires. This requires that the wire-connecting method must use different points of reference on the bond pads and bond wires, depending upon which type of bond pad is to be connected to.

The concept of using interleaved bond pads, while shown with bond wires, is equally applicable to the other types of conductive lines discussed hereinabove, such direct attachment of bond pads to conductive leads or traces (e.g., leadframe attachment as in TAB packages).

With "certain non-square" contact shapes and alternating interleaved linear arrays of bond pads, as with elongated bond pads, the discussion hereinabove generally assumes that the major axis of a contact footprint is in perfect alignment with the approach angle. In cases where there is an offset angle between the major axis of the contact footprint and the approach angle, the same technique described hereinabove may be used by providing a compensation for this offset in the orientation of the bond pads, without loss of generality. That is, use the major axis of the anticipated contact footprint as the approach angle.

Other aspects of the present invention discussed hereinabove, such as radial patterns of bond pad orientation, tapered bond pad shapes, etc., may be used alone or in combination.

Using the method of the present invention, it is possible to create integrated circuits having significantly larger numbers of interface signals (and therefore larger numbers of bond pads) than is possible using prior art bond pad design for a given die size.

What is claimed is:

1. Method of forming non-square bond pad shapes for a semiconductor die, comprising:
   defining a contact footprint shape;
   defining a pivot point within the contact footprint shape;
   defining a swept contact area by sweeping the contact footprint shape through a range of angles about the pivot point;
   providing a bond pad shape which encloses the swept contact area.

2. A method according to claim 1, further comprising;
   providing a safety zone around the swept contact area; wherein:
   the bond pad shape further encloses the safety zone.

3. A method according to claim 1 wherein: the bond pad shape is polygonal.

4. A method according to claim 1 wherein: the bond pad shape is curved.

5. A method according to claim 1, wherein:
   an anchor point in the bond pad shape is defined by the location of the pivot point in the swept contact area which the bond pad shape encloses.

6. Method of forming non-square bond pad shapes for a semiconductor die, comprising:
   defining a contact footprint shape;
   defining a pivot point within the contact footprint shape;
   defining a swept contact area by sweeping the contact footprint shape through a range of angles about the pivot point;
   providing a bond pad shape which encloses the swept contact area;
   wherein:
   the pivot point within the contact footprint shape is located substantially towards one end of the contact footprint shape.

7. Method according to claim 6, further comprising; providing a safety zone around the swept contact area; wherein: the bond pad shape further encloses the safety zone.

8. A method according to claim 6 wherein: the bond pad shape is polygonal.

9. A method according to claim 6 wherein: the bond pad shape is curved.

10. A method, according to claim 6, wherein:
    an anchor point in the bond pad shape is defined by the location of the pivot point in the swept contact area which the bond pad shape encloses.

* * * * *